(12) United States Patent
Pan et al.

(10) Patent No.: US 8,581,268 B2
(45) Date of Patent: Nov. 12, 2013

(54) LIGHT EMITTING DIODE WITH A CURRENT CONCENTRATING STRUCTURE

(75) Inventors: Qunfeng Pan, Xiamen (CN); Jyh Chiarng Wu, Xiamen (CN); Kechuang Lin, Xiamen (CN); Shaohua Huang, Xiamen (CN)

(73) Assignee: Xiamen Sanan Optoelectronics Technology Co., Ltd., Xiamen (CN)

( * ) Notice: Subject to any disclaimer, the term of this patent is extended or adjusted under 35 U.S.C. 154(b) by 0 days.

(21) Appl. No.: 13/541,847

(22) Filed: Jul. 5, 2012

(65) Prior Publication Data
US 2012/0273814 A1    Nov. 1, 2012

Related U.S. Application Data

(63) Continuation of application No. PCT/CN2011/083621, filed on Dec. 7, 2011.

(30) Foreign Application Priority Data

Dec. 16, 2010    (CN) .......................... 2010 1 0590655

(51) Int. Cl.
*H01L 33/42* (2010.01)
*H01L 33/08* (2010.01)

(52) U.S. Cl.
USPC .......... 257/88; 257/99; 257/90; 257/E33.064; 438/22; 438/24; 438/46; 438/47

(58) Field of Classification Search
USPC ............ 257/88, 99, 90, E33.064; 438/22, 24, 438/46, 47
See application file for complete search history.

(56) References Cited

U.S. PATENT DOCUMENTS 5,821,555 A * 10/1998 Saito et al. ...................... 257/13

FOREIGN PATENT DOCUMENTS

| JP | 2008135554 | 6/2008 |
| JP | 2008210903 | 9/2008 |

OTHER PUBLICATIONS

First Office Action (with English summary) in CN Application No. 201010590655.0; Feb. 29, 2012.
International Search Report (with English summary) in PCT/CN2011/083621; Mar. 15, 2012.

* cited by examiner

*Primary Examiner* — Thinh T Nguyen
(74) *Attorney, Agent, or Firm* — Syncoda LLC; Feng Ma

(57) ABSTRACT

A light emitting diode (LED) includes a transparent insulating layer; and at least one transparent conductive oxide layer substantially enclosing the transparent insulating layer, wherein the transparent insulating layer and the at least one transparent conductive oxide layer are configured to distribute a current through the LED toward a peripheral region of the LED.

17 Claims, 4 Drawing Sheets

LIGHT EMITTING DIODE WITH A CURRENT CONCENTRATING STRUCTURE

CROSS-REFERENCE TO RELATED APPLICATIONS

The present application is a continuation of PCT/CN2011/083621 filed on Dec. 7, 2011, which claims priority to Chinese Patent Application No. 201010590655.0 filed on Dec. 16, 2010. The disclosures of the above applications are hereby incorporated by reference in their entirety.

BACKGROUND

Gallium nitride (GaN) based light-emitting diodes (LEDs) have been widely used in applications such as cell phone keys, signs for directions, displays, backlighting, and lighting, etc. Many of these systems may employ a plurality of LEDs as light sources.

SUMMARY in an aspect, an LED is provided including a transparent insulating layer; and at least one transparent conductive oxide layer substantially enclosing the transparent insulating layer, wherein the transparent insulating layer and the at least one transparent conductive oxide layer are configured to distribute a current through the LED toward a peripheral region of the LED.

In some implementations, the at least one transparent conductive oxide layer includes: a first transparent conductive oxide layer; and a second transparent conductive oxide layer, wherein the transparent insulating layer is substantially sandwiched between the first and second transparent conductive oxide layers.

In some implementations, the transparent insulating layer has an inward recess relative to the first transparent conductive oxide layer of about 1~50 microns.

In some implementations, the inward recess is about 20 microns or less.

In some implementations, the first and second transparent oxide layers are electrically coupled at the peripheral region of the LED corresponding to the inward recess.

In some implementations, the LED further include: a sapphire substrate; a light-emitting epitaxy layer disposed over the sapphire substrate and comprising a an n-type GaN-based epitaxial layer, an active layer, and a p-type GaN-based epitaxial layer; a p-electrode formed over the second transparent conductive oxide layer; and an n-electrode formed over the n-type GaN-based epitaxial layer, wherein the first transparent conductive oxide layer is over the p-type GaN-based epitaxial layer, and wherein the second transparent conductive oxide layer substantially encloses a side surface of the transparent insulating layer.

In some implementations, the first transparent conductive oxide layer comprises at least one material selected from indium oxide, tin oxide, indium tin oxide, zinc oxide.

in some implementations, the transparent insulating layer includes at least one material selected from silicon oxide, titanium oxide, silicon nitride, aluminum oxide, magnesium fluoride, SOG, Polymer.

In some implementations, the transparent insulation layer comprises silicon nitride.

In some implementations, the second transparent conductive oxide layer comprises at least one material selected from indium oxide, tin oxide, indium tin oxide, zinc oxide.

In some implementations, the p-electrode is disposed in a central local area of the second transparent conductive oxide layer.

In another aspect, a method of manufacturing an LED is provided, the method including: providing a transparent insulating layer; and substantially enclosing the transparent insulating layer with at least one transparent conductive oxide layer, wherein the transparent insulating layer and the at least one transparent conductive oxide layer are configured to distribute a current through the LED toward a peripheral region of the LED.

In some implementations, said enclosing includes: forming a first transparent conductive oxide layer; and forming a second transparent conductive oxide layer, wherein the transparent insulating layer is substantially sandwiched between the first and second transparent conductive oxide layers.

In some implementations, the transparent insulating layer has an inward recess relative to the first transparent conductive oxide layer of about 1~50 microns.

In some implementations, the inward recess is about 20 microns or less.

In some implementations, the method further includes forming an electrical connection between the first and second transparent oxide layers at the peripheral region of the LED corresponding to the inward recess.

In some implementations, the method further includes: providing a sapphire substrate; forming a light-emitting epitaxy layer over the sapphire substrate including an n-type GaN-based epitaxial layer, an active layer, and a p-type GaN-based epitaxial layer; forming a p-electrode over the second transparent conductive oxide layer; and forming an n-electrode over the n-type GaN-based epitaxial layer, wherein the first transparent conductive oxide layer is formed over the p-type GaN-based epitaxial layer, and wherein the second transparent conductive oxide layer substantially encloses a side surface of the transparent insulating layer.

In another aspect, a display, signage, or lighting system is provided including a plurality of LEDs, wherein each LED includes a transparent insulating layer; and at least one transparent conductive oxide layer substantially enclosing the transparent insulating layer, wherein the transparent insulating layer and the at least one transparent conductive oxide layer are configured to distribute a current through the LED toward a peripheral region of the LED.

In some implementations, the at least one transparent conductive oxide layer includes: a first transparent conductive oxide layer; and a second transparent conductive oxide layer, wherein the transparent insulating layer is substantially sandwiched between the first and second transparent conductive oxide layers.

In some implementations, the transparent insulating layer has an inward recess relative to the first transparent conductive oxide layer of about 1~50 microns.

DETAILED DESCRIPTION

Some GaN-based LED chips adopt a dual-electrode horizontal-distribution forward-assembly structure. The basic structure may include, over the light-emitting epitaxial layer, a transparent electrode layer as an ohmic contact layer and a current expansion layer. Over the transparent electrode, a metal electrode (p electrode) may be disposed for use with soldering. However, the presence of metal electrodes may cause the light emitted from the active layer being blocked and absorbed, thereby reducing the light extraction efficiency of the LED chip.

Figure 1:
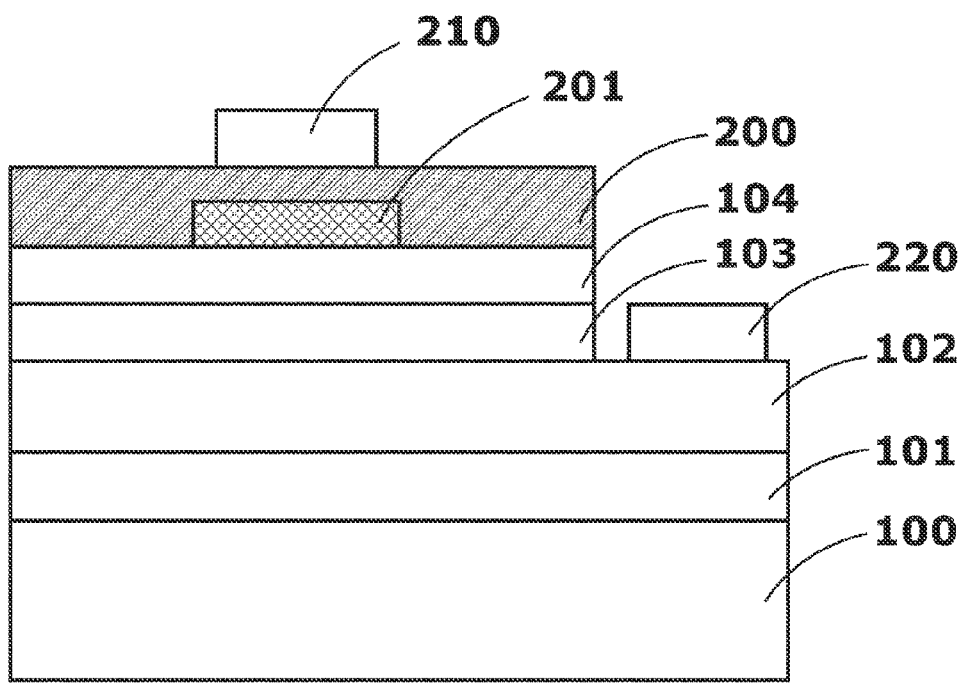
FIG. 1 illustrates an LED structure having a current-blocking structure.

It may be possible to suppress or reduce the carrier transport and their combination light emission in the active layer underneath the metal electrodes. For example, a current blocking structure may be introduced to the chip architecture, such as by disposing an insulating layer between the transparent electrode and the p-type GaN-based epitaxial layer. The insulating layer region, along the axial direction of the chip, may enclose the p-electrode region. As shown in FIG. 1, the GaN-based LED with a current-blocking structure may include a sapphire substrate 100, a buffer layer 101, an n-GaN layer 102, a multi-quantum well active layer 103, a p-GaN layer 104, an ITO layer (transparent electrode) 200, an insulating layer 201, a p-electrode 210, and an n-electrode 220.

During the fabrication process, the buffer layer 101 may be formed over the sapphire substrate 100, the n-GaN layer 102 may be formed over the buffer layer 101, the multi-quantum well active layer 103 may be formed over the n-GaN layer 102, the p-GaN layer may be formed over the multi-quantum well active layer 103, the $SiO_2$ layer 201 may be formed over a portion of the area of the p-GaN layer 104, the ITO layer 200 may be formed over another portion of the area of the p-GaN layer 104 and over the $SiO_2$ layer 201, the p-electrode 210 may be formed over the ITO layer 200, and the p-electrode 210 in the axial direction may be enclosed by the $SiO_2$ layer 201, and the n-electrode 220 may be formed over the n-GaN layer 102.

In the GaN-based LED shown in FIG. 1, by suppressing the current injection and light emission in the active layer 103 underneath the p-electrode 210, the light absorption by the metal electrode may be reduced. However, this structure may make the current injection and recombination emission mostly concentrated in the peripheral area of the $SiO_2$ layer 201. The $SiO_2$ layer, which may serve as a current blocking structure, is usually positioned in the central region of the chip. As such, the structure may make the current injection and light emission concentrated adjacent the central local area of the chip.

Figure 2:
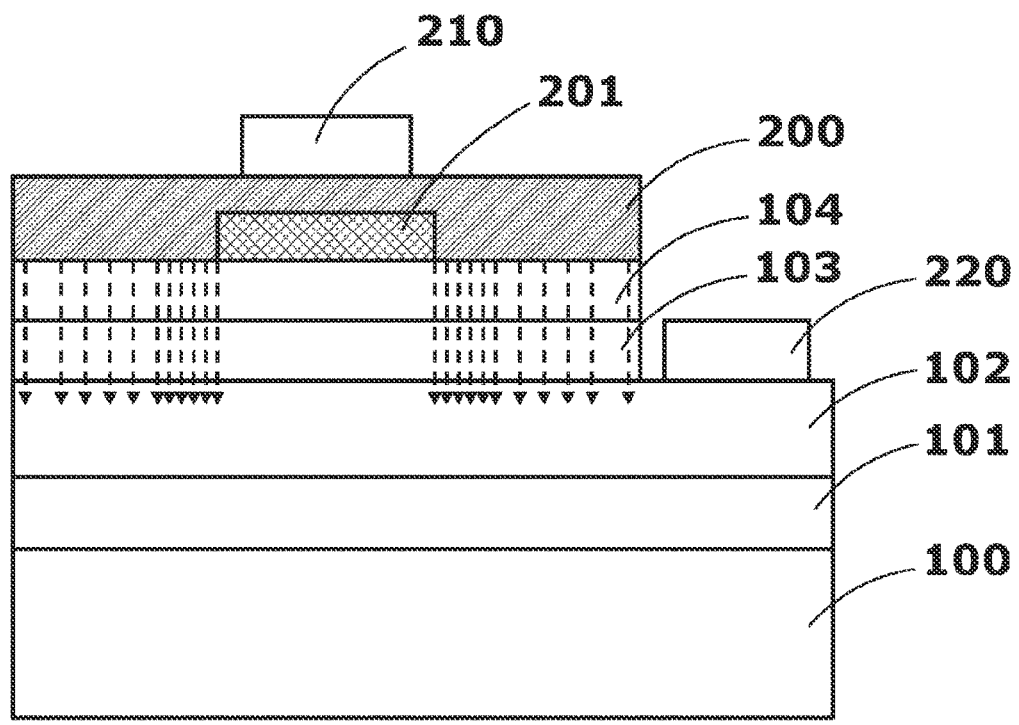
FIG. 2 is a schematic diagram of current distribution in the LED structure of FIG. 1.

FIG. 2 illustrates a possible current distribution in the LED structure of FIG. 1. The light output sides of the chip may include the front, the back, and the side. The side light output may constitute a certain portion of the light output. Photons may come from different positions of the active layer, with different side light extraction probability. For the local areas adjacent to the center of the chip, due to the higher probability for a photon being absorbed during the multiple internal reflection process, there is a reduced probability of the side extraction of light. For the peripheral region of the chip away from the central region, there is a higher probability for photons to be extracted from the side. Thus, for the LED structure illustrated in FIGS. 1 and 2, for which the current distribution is more concentrated in the chip close to the central local region, there may be reduced probability of the side light output, leading to reduced light extraction efficiency of the LED.

Embodiments disclosed herein provide a type of GaN-based LEDs having a current concentrating or blocking structure as described with respect to some examples below. In some examples, the current concentrating/blocking structure may be referred to as a "sandwich" structure, and is configured to redistribute current toward a peripheral region of the LED. Advantageously, the light extraction efficiency of the LED can be improved.

In some implementations, an LED structure is provided including a sapphire substrate, and a plurality of layers disposed over the sapphire substrate. The layers may include an n-type GaN-based epitaxial layer, an active layer, a p.-type GaN based epitaxial layer, a first transparent conductive oxide layer formed over the p-type GaN-based epitaxial layer, and a transparent insulating layer formed over the first transparent conductive oxide layer.

The transparent insulating layer coverage area may have an inward recess relative to the first transparent conductive oxide layer. In some implementations, he inward recess may be about 1~50 microns. The stricture may further comprise a second transparent conductive oxide layer formed over the transparent insulating layer. The second transparent conductive oxide layer coverage area may have an outward expansion relative to the transparent insulating layer, and may be in an electrical connection with the first transparent conductive oxide layer. A p-electrode may be formed over the second transparent conductive oxide layer, and an n-electrode may be formed over the n-type GaN-based epitaxial layer.

The first transparent conductive oxide layer may be formed with at least one material selected from indium oxide, tin oxide, indium tin oxide, zinc oxide.

The transparent insulating layer may be formed with at least one material selected from silicon oxide, titanium oxide, silicon nitride, aluminum oxide, magnesium fluoride, SOG, Polymer.

The transparent insulation materials may be formed with silicon nitride. The transparent conductive oxide layer materials may have a refractive index of about 1.8~2.0. For refractive index matching, an implementation preferably adopts silicon nitride with an optimal refractive index (about 1.9) as the material to form the transparent insulating layer.

In some implementations, the transparent insulating layer may have an inward recess relative to the first transparent conductive oxide layer of less than 20 microns.

The p-electrode may be disposed at a central local area with respect to the second transparent conductive oxide layer.

In some examples, a "sandwich" structure may be provided, including at least one transparent conductive oxide layer substantially enclosing a transparent insulating layer. For example, the sandwich structure may include a first transparent conductive oxide layer, a transparent insulating layer, and a second transparent conductive oxide layer. The first transparent conductive oxide layer may form an ohmic contact with the p-type GaN-based epitaxial layer. The second transparent conductive oxide layer may form an electrical connection between the first transparent conductive oxide layer and the p-electrode. The transparent insulation layer may isolate the first transparent conductive oxide layer and the second transparent conductive oxide layer, and limit the current conduction path in the first transparent conductive oxide layer to be a lateral or transverse transmission from the outside to the inside.

The transparent insulating layer may be recessed relative to the first transparent conductive oxide layer. The scale of the recess may be limited to within a range of about 1~50 microns. As such, the first transparent conductive oxide layer and the second transparent conductive oxide layer may come into contact only in the chip peripheral region, such as an outer ring, at the about 1~50 microns region. As a result, the current may first inject from the first transparent conductive oxide layer into the light-emitting layer, adjacent to the chip outer ring region. In addition, because the transparent conductive oxide layer may have a certain degree of lateral transmission resistance, the current distribution in the light-emitting epitaxial layer may be decreasing from outside to inside. For example, the closer to the chip central region (e.g., corresponding to the p-electrode position), the smaller the current density may become. The current density may even approach to zero near the chip central region. Therefore, the current concentrating or blocking structure can effectively prevent the shading of the p electrode. In addition, due to that the current injects more from the peripheral region to the active layer, the chip active layer of the peripheral region may emit more photons. Because the photon side extraction probability is higher for the peripheral region, a higher light extraction efficiency can be obtained from the disclosed current-blocking.

Some embodiments are described in more detail below with reference to FIGS. 3 and 4.

Figure 3:
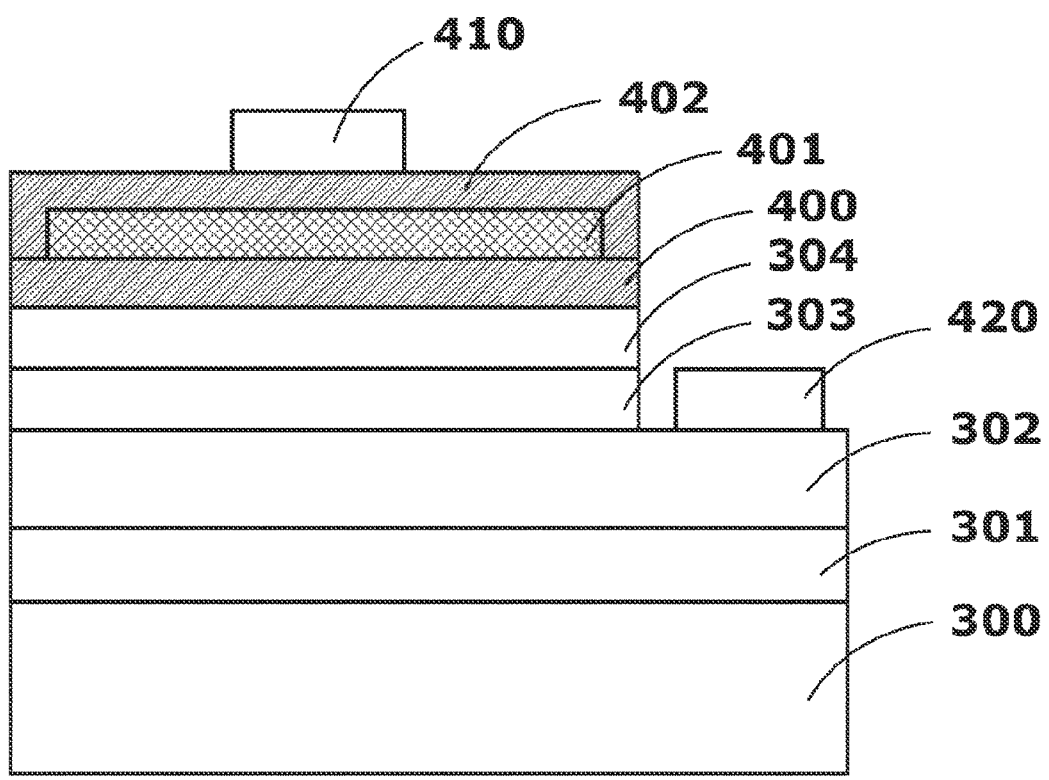
FIG. 3 is diagram of an LED structure having a current-concentrating structure according to some of the disclosed embodiments.

FIG. 3 illustrates an GaN-based LED structure having a current-concentrating/blocking structure. The LED as shown includes a sapphire substrate 300, a buffer layer 301, an n-GaN layer 302, a multi-quantum well active layer 303, a p-GaN layer 304, a first ITO layer 400, a $Si_3N_4$ layer 401, a second ITO layer 402, a p-electrode 410, and n-electrode 420.

During a fabrication process, the buffer layer 301 may be formed over the sapphire substrate 300, the n-GaN layer 302 may be formed over the buffer layer 301, and the multi-quantum well active layer 303 may be formed over the n-GaN layer 302. The multi-quantum well active layer 303 may comprise, for example, indium gallium nitride (InGaN). The p-GaN layer 304 may be formed over the multi-quantum well active layer 303, and the first ITO layer 400 may be formed over the p-GaN layer 304.

In an example, a "sandwich" structure may be provided comprising the first ITO layer 400, the $Si_3N_4$ layer 401, and the second ITO layer 402, used as the current concentrating/blocking structure. The first ITO layer 400 may form an ohmic contact with the p-GaN layer 304. The second ITO layer 402 may electrically connect the first ITO layer 400 and the p-electrode 410. The transparent insulating layer of $Si_3N_4$ layer 401 may be used to isolate the first ITO layer 400 and the second ITO layer 402, and constrain the current conduction path in the first ITO layer 400 to be generally from the outside to the inside transversely.

In particular, the $Si_3N_4$ layer as the transparent insulating layer may be formed over the first ITO layer 400. The portion of the first ITO layer covered by the $Si_3N_4$ layer 401 may have an about 10 micron proportional inward recess relative to the first ITO layer 400. The second ITO layer 402 may be formed over the $Si_3N_4$ layer 401, and form an electrical connection with the portion of the first ITO layer 400 exposed as a result of the inward recess of the $Si_3N_4$ layer. The p-electrode 410 may be formed over the second ITO layer 402 in the central local area. The p-electrode may comprise, for example, Cr/Pt/Au. The n-electrode 420 may be formed over the n-GaN layer 302, and may comprise Cr/Pt/Au.

Figure 4:
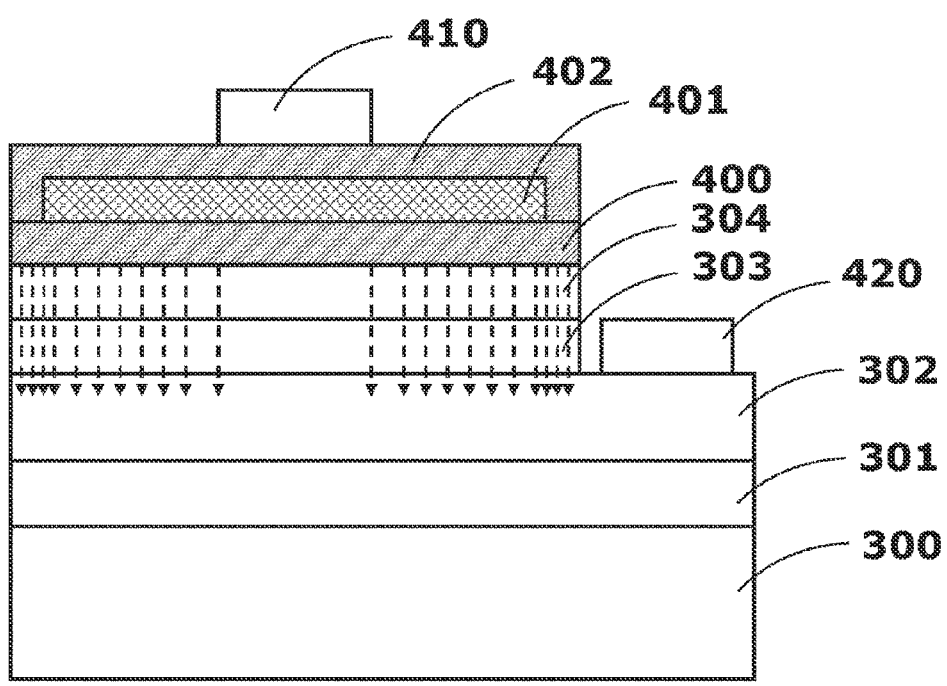
FIG. 4 is a schematic diagram of current distribution in the LED structure of FIG. 3.

As shown in FIG. 4, the current injection path of the LED structure illustrated in FIG. 3 may sequentially include the p electrode 410, the second ITO layer 402, the first ITO layer 400, the p-GaN layer 304, the multi-quantum well active layer 303, the n-GaN layer 302, and the n-electrode 420. As a result of the introduction of the $Si_3N_4$ layer 401 and its "inward recess" positioning, the current transmission in the first ITO layer 400 may be constrained as a transverse transmission from outside to inside. Because the transverse transmission of the current in the ITO layer has a certain resistance, the current injection may be more concentrated in the peripheral area of the chip, and the resulting light-emitting may be higher in this region than in the chip central region. Since the chip peripheral (e.g., outer ring) region may have a higher photon side extraction probability, a higher light extraction efficiency for the LED can be obtained.

Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A light-emitting diode (LED) comprising:
   a transparent insulating layer; and
   at least one transparent conductive oxide layer substantially enclosing the transparent insulating layer,
   wherein the transparent insulating layer and the at least one transparent conductive oxide layer are configured to distribute a current through the LED toward a peripheral region of the LED;
   wherein the at least one transparent conductive oxide layer comprises:
   a first transparent conductive oxide layer; and
   a second transparent conductive oxide layer,
   wherein the transparent insulating layer is substantially sandwiched between the first and second transparent conductive oxide layers.

2. The LED of claim 1, wherein the transparent insulating layer has an inward recess relative to the first transparent conductive oxide layer of about 1~50 microns.

3. The LED of claim 2, wherein the inward recess is about 20 microns or less.

4. The LED of claim 2, wherein the first and second transparent oxide layers are electrically coupled at the peripheral region of the LED corresponding to the inward recess.

5. The LED of claim 2, further comprising:
   a sapphire substrate;
   a light-emitting epitaxy layer disposed over the sapphire substrate and comprising a an n-type GaN-based epitaxial layer, an active layer, and a p-type GaN-based epitaxial layer;
   a p-electrode formed over the second transparent conductive oxide layer; and
   an n-electrode formed over the n-type GaN-based epitaxial layer,
   wherein the first transparent conductive oxide layer is over the p-type GaN-based epitaxial layer, and
   wherein the second transparent conductive oxide layer substantially encloses a side surface of the transparent insulating layer.

6. The LED of claim 5, wherein the first transparent conductive oxide layer comprises at least one material selected from indium oxide, tin oxide, indium tin oxide, zinc oxide.

7. The LED of claim 5, wherein the transparent insulating layer comprises at least one material selected from silicon oxide, titanium oxide, silicon nitride, aluminum oxide, magnesium fluoride, SOG, Polymer.

8. The LED of claim 7, wherein the transparent insulation layer comprises silicon nitride.

9. The LED of claim 5, wherein the second transparent conductive oxide layer comprises at least one material selected from indium oxide, tin oxide, indium tin oxide, zinc oxide.

10. The LED of claim 5, wherein the p-electrode is disposed in a central local area of the second transparent conductive oxide layer.

11. A method of manufacturing a light-emitting diode (LED), the method comprising:
providing a transparent insulating layer; and
substantially enclosing the transparent insulating layer with at least one transparent conductive oxide layer,
wherein the transparent insulating layer and the at least one transparent conductive oxide layer are configured to distribute a current through the LED toward a peripheral region of the LED;
wherein said enclosing comprises:
forming a first transparent conductive oxide layer; and
forming a second transparent conductive oxide layer,
wherein the transparent insulating layer is substantially sandwiched between the first and second transparent conductive oxide layers.

12. The method claim 11, wherein the transparent insulating layer has an inward recess relative to the first transparent conductive oxide layer of about 1~50 microns.

13. The method of claim 12, wherein the inward recess is about 20 microns or less.

14. The method of claim 13, further comprising forming an electrical connection between the first and second transparent oxide layers at the peripheral region of the LED corresponding to the inward recess.

15. The method of claim 14, further comprising:
providing a sapphire substrate;
forming a light-emitting epitaxy layer over the sapphire substrate including an n-type GaN-based epitaxial layer, an active layer, and a p-type GaN-based epitaxial layer;
forming a p-electrode over the second transparent conductive oxide layer; and
forming an n-electrode over the n-type GaN-based epitaxial layer,
wherein the first transparent conductive oxide layer is formed over the p-type GaN-based epitaxial layer, and
wherein the second transparent conductive oxide layer substantially encloses a side surface of the transparent insulating layer.

16. A display, signage, or lighting system comprising a plurality of light-emitting diodes (LEDs), wherein each LED comprises:
a transparent insulating layer; and
at least one transparent conductive oxide layer substantially enclosing the transparent insulating layer,
wherein the transparent insulating layer and the at least one transparent conductive oxide layer are configured to distribute a current through the LED toward a peripheral region of the LED;
wherein the at least one transparent conductive oxide layer comprises:
a first transparent conductive oxide layer; and
a second transparent conductive oxide layer,
wherein the transparent insulating layer is substantially sandwiched between the first and second transparent conductive oxide layers.

17. The system of claim 16, wherein the transparent insulating layer has an inward recess relative to the first transparent conductive oxide layer of about 1~50 microns.

* * * * *